United States Patent
Guo et al.

(10) Patent No.: US 10,613,943 B2
(45) Date of Patent: Apr. 7, 2020

(54) METHOD AND SYSTEM FOR IMPROVING OPEN BLOCK DATA RELIABILITY

(71) Applicant: Western Digital Technologies, Inc., San Jose, CA (US)

(72) Inventors: Zelei Guo, San Jose, CA (US); Chao-Han Cheng, San Jose, CA (US); Nan Lu, San Jose, CA (US); Tienchien Kuo, Sunnyvale, CA (US); Niles Nian Yang, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 1 day.

(21) Appl. No.: 16/045,339

(22) Filed: Jul. 25, 2018

(65) Prior Publication Data

US 2019/0034290 A1 Jan. 31, 2019

Related U.S. Application Data

(60) Provisional application No. 62/537,905, filed on Jul. 27, 2017.

(51) Int. Cl.
*G06F 11/14* (2006.01)
*G06F 11/10* (2006.01)
(Continued)

(52) U.S. Cl.
CPC .......... *G06F 11/1458* (2013.01); *G06F 3/064* (2013.01); *G06F 3/065* (2013.01);
(Continued)

(58) Field of Classification Search
CPC .... G06F 11/1458; G06F 3/0614; G06F 3/064; G06F 3/065; G06F 3/0679; G06F 11/106;
(Continued)

(56) References Cited

U.S. PATENT DOCUMENTS 7,971,081 B2 * 6/2011 Cooper ................. G06F 1/3203
365/228
2005/0144367 A1 * 6/2005 Sinclair ............... G06F 12/0246
711/103

(Continued)

OTHER PUBLICATIONS

Chang, Y-H., et al., "A Management Strategy for the Reliability and Performance Improvement of MLC-Based Flash-Memory Storage Systems," IEEE Transactions on Computers vol. 60, Issue: 3, Mar. 2011, pp. 305-320. (Year: 2011).*

*Primary Examiner* — Kyle Vallecillo
(74) *Attorney, Agent, or Firm* — Morgan, Lewis & Bockius LLP

(57) ABSTRACT

Systems, methods, and/or devices are used to manage open blocks within non-volatile storage devices, in order to improve the reliability of non-volatile storage devices. In some embodiments, when a shut-down request is received from a host device, the storage device fetches information about open blocks and their boundary regions susceptible to data reliability issues, and for each identified boundary region, the storage device programs a region contiguous to the identified boundary region. In some embodiments, the device updates an XOR parity table used for XOR parity management with the information that the region contiguous to the identified boundary is programmed. Subsequently, in some embodiments, the storage device can use the information, stored in the contiguous region and/or the XOR parity table, for data recovery in the event of a data loss. As a result, the reliability of the non-volatile storage device is improved.

20 Claims, 9 Drawing Sheets

(51) Int. Cl.
*G06F 3/06* (2006.01)
*G06F 12/02* (2006.01)
*G11C 16/10* (2006.01)

(52) U.S. Cl.
CPC .......... *G06F 3/0614* (2013.01); *G06F 3/0679* (2013.01); *G06F 11/106* (2013.01); *G06F 11/1072* (2013.01); *G06F 11/1076* (2013.01); *G06F 11/1441* (2013.01); *G06F 12/0246* (2013.01); *G06F 2212/1024* (2013.01); *G06F 2212/1036* (2013.01); *G06F 2212/7202* (2013.01); *G11C 16/10* (2013.01); *G11C 16/105* (2013.01)

(58) Field of Classification Search
CPC ............. G06F 11/1072; G06F 11/1441; G06F 12/0246; G11C 16/10
See application file for complete search history.

(56) References Cited

U.S. PATENT DOCUMENTS

| | | | |
|---|---|---|---|
| 2016/0139821 A1* | 5/2016 | Dolph | G06F 3/0611 711/103 |
| 2017/0123655 A1* | 5/2017 | Sinclair | G06F 3/0611 |
| 2017/0123666 A1* | 5/2017 | Sinclair | G06F 3/0604 |
| 2017/0123682 A1* | 5/2017 | Sinclair | G06F 3/0611 |
| 2017/0123726 A1* | 5/2017 | Sinclair | G06F 3/0659 |
| 2017/0177235 A1* | 6/2017 | Nishikubo | G06F 3/0659 |
| 2018/0107412 A1* | 4/2018 | Jun | G06F 3/0652 |
| 2018/0293011 A1* | 10/2018 | Schluessler | G06F 1/3275 |
| 2018/0365147 A1* | 12/2018 | Fevrier | G06F 12/0804 |

\* cited by examiner

Open Block Status Table 226

| | Block ID | Last Written Word Line ID |
|---|---|---|
| Header 316-0 | | |
| Record 316-1 | PA 3 | WL 2 |
| | ⋮ | ⋮ |
| Record 316-z | PA z | WL w |

Before shutdown request

| Page # | XOR Parity Stripe # |
|---|---|
| 0 | X0 |
| 1 | X1 |
| 2 | X2 |
| 3 | X3 |
| 4 | X0 |
| 5 | X1 |
| 6 | X2 |
| 7 | X3 |
| 8 | X0 |
| 9 | X1 |
| 10 | X2 |
| 11 | X3 |
| 12 | X0 |
| 13 | X1 |
| 14 | X2 |
| 15 | X3 |
| ... | ... |

After shutdown request

| Page # | XOR Parity Stripe # |
|---|---|
| 0 | X0 |
| 1 | X1 |
| 2 | X2 |
| 3 | X3 |
| 4 | X0 |
| 5 | X1 |
| 6 | X2 |
| 7 | X3 |
| 8 | X0 (same data as p6) |
| 9 | X1 (same data as p7) |
| 10 | X2 |
| 11 | X3 |
| 12 | X0 |
| 13 | X1 |
| 14 | X2 |
| 15 | X3 |
| ... | ... |

- Programmed region
- Original boundary region
- Padded region at host shutdown request
- Erased region during power-off
- Xi  XOR parity stripe #, i=0,...,3

Figure 3E

With padded data (322)

| Page # | XOR Parity Stripe # |
|---|---|
| 0 | X0 |
| 1 | X1 |
| 2 | X2 |
| 3 | X3 |
| 4 | X0 |
| 5 | X1 |
| 6 | X2 |
| 7 | X3 |
| 8 | X0 (same data as p6) |
| 9 | X1 (same data as p7) |
| 10 | X2 |
| 11 | X3 |
| 12 | X0 |
| 13 | X1 |
| 14 | X2 (same data as p12) |
| 15 | X3 (same data as p13) |

XOR parity bitmap for right (wt padding) (330)

| | |
|---|---|
| X0 | 1011b |
| X1 | 1011b |
| X2 | 0111b |
| X3 | 0111b |

Legend:
- Valid data
- Padded data at host shutdown request
- Xi — XOR parity stripe #, i=0,...,3

Without padded data (334)

| Page # | XOR Parity Stripe # |
|---|---|
| 0 | X0 |
| 1 | X1 |
| 2 | X2 |
| 3 | X3 |
| 4 | X0 |
| 5 | X1 |
| 6 | X2 |
| 7 | X3 |
| 8 | X0 |
| 9 | X1 |
| 10 | X2 |
| 11 | X3 |
| 12 | X0 |
| 13 | X1 |
| 14 | X2 |
| 15 | X3 |

XOR parity bitmap for left (no padding) (332)

| | |
|---|---|
| X0 | 1111b |
| X1 | 1111b |
| X2 | 1111b |
| X3 | 1111b |

Figure 3F

METHOD AND SYSTEM FOR IMPROVING OPEN BLOCK DATA RELIABILITY

RELATED APPLICATIONS

This application claims priority to U.S. Provisional Patent Application 62/537,905, filed Jul. 27, 2017, which is hereby incorporated by reference in its entirety.

TECHNICAL FIELD

The disclosed embodiments relate generally to command processing in a storage device (e.g., a device including one or more flash memory devices), and in particular, to open block management.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even without power, as opposed to volatile memory, which requires power to maintain the stored information.

Executing a write operation at a first portion (e.g., a first word line within an erase block) of a semiconductor memory device (e.g., flash memory device) can impact the charge stored in a second, neighboring portion (e.g., a second word line within the erase block) of the semiconductor memory device. As a result, write operations are configured to take into account the effects of subsequent write operations in neighboring portions. However, in an open block, after writing data to the first portion (sometimes herein called a boundary region), data has not been written to the second, neighboring portion, and therefore the first portion tends to have worse data reliability compared with closed blocks.

SUMMARY

Without limiting the scope of the appended claims, after considering this disclosure, and particularly after considering the section entitled "Detailed Description," one will understand how the aspects of various embodiments are implemented and used to manage open blocks within non-volatile storage devices, in order to improve the reliability of non-volatile storage devices. In some embodiments, when a shut-down request is received from a host device, the storage device fetches information about open blocks and their boundary regions susceptible to data reliability issues, and for each identified boundary region, the storage device programs a region contiguous to the identified boundary region. In some embodiments, the device updates an XOR parity table used for XOR parity management with the information that the region contiguous to the identified boundary is programmed. Subsequently, in some embodiments, the storage device can use the information, stored in the contiguous region and/or the XOR parity table, for data recovery in the event of a data loss. As a result, the reliability of the non-volatile storage device is improved.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 3E is a diagram illustrating open block boundary region data padding in response to a host shut-down request.

FIG. 3F is a diagram illustrating an XOR parity table with and without padded data in a block.

Figure 1:
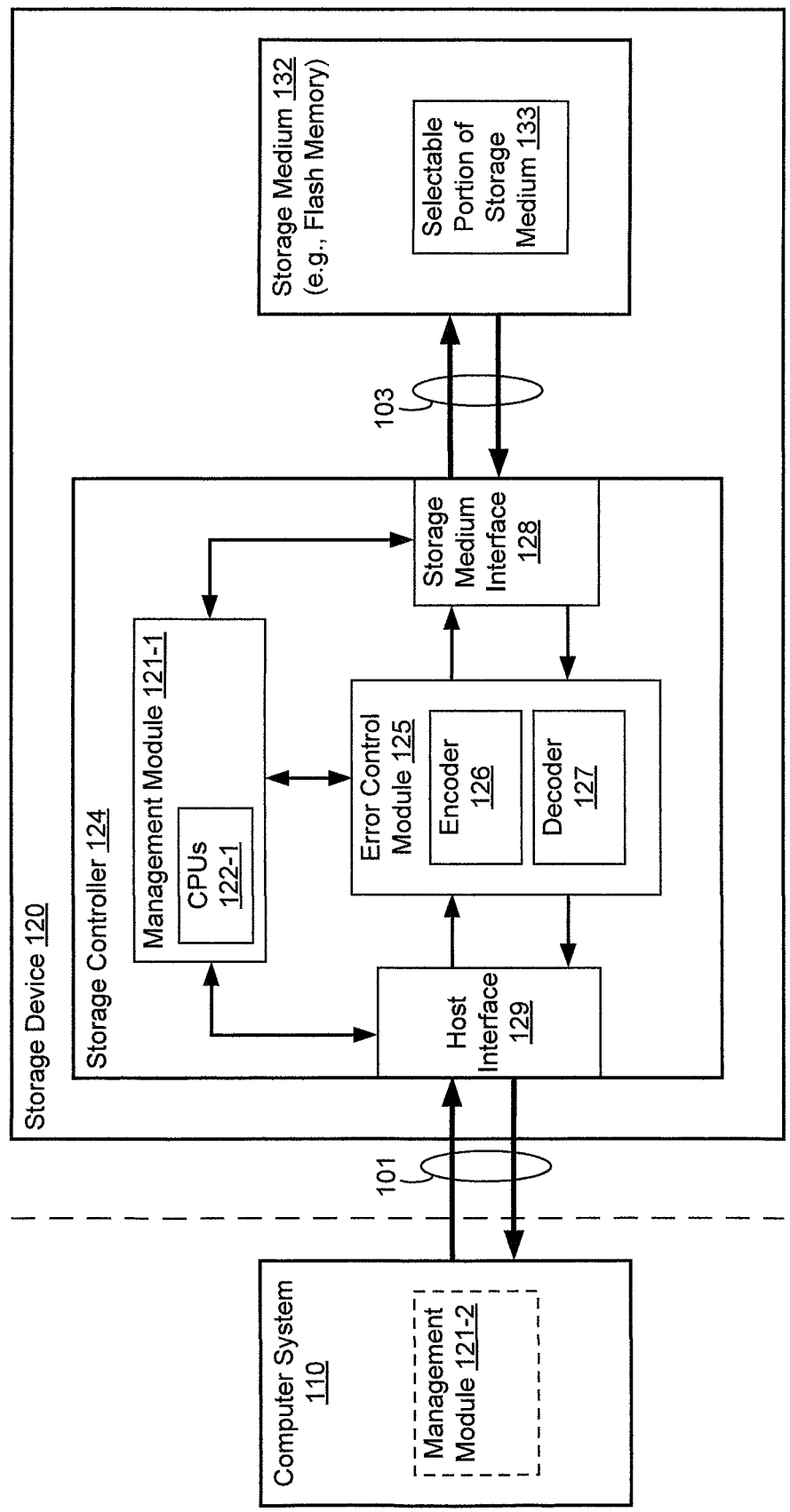
FIG. 1 is a block diagram illustrating a data storage system in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Erroneous readings and/or elevated bit error rates negatively impact the reliability and desirability of a storage device. Open block boundary regions tend to have worse data reliability compared with closed blocks. Consequently, what is desired are mechanisms for managing open blocks within a storage device (e.g., a non-volatile storage device, such as a flash memory device), in order to improve the reliability of the open blocks.

The various embodiments described herein include systems, methods, and/or devices used to manage open blocks within a storage device. In one aspect, the method comprises receiving a shut-down request from an external host device, and in response to receiving the shut-down request, programming a region contiguous to the respective boundary regions of open blocks, and optionally updating an XOR parity table appropriately. Subsequent data recovery operations use the data stored in the contiguous regions and the XOR parity table.

(A1) More specifically, some embodiments include a method of managing a storage device that includes a plurality of non-volatile memory blocks. In some embodiments, the method includes receiving at the storage device, from a host device external to the storage device, a shut-down request. In response to receiving the shut-down request, the method includes obtaining a list of open blocks, each having at least one un-programmed word line (i.e., a word line to which data can be written). The method further includes, for each block in the list of open blocks, identifying a boundary region of the block, and programming data in a region that is contiguous to the identified boundary region.

(A2) In some embodiments of the method of A1, programming the data includes copying the data in the identified boundary region to the region that is contiguous to the identified boundary region.

(A3) In some embodiments of the method of A2, in response to receiving the shut-down request, the method further includes updating, for a respective open block in the list, an XOR parity table for the open block, where a table entry in the XOR parity table corresponds to an XOR parity stripe and includes a plurality of bits. Further, each bit corresponds to a distinct region in the respective open block and indicates whether the corresponding region is the region contiguous to the identified boundary region of the respective open block. In some embodiments, each bit of an entry in the XOR parity table indicates whether data, if any, stored in the corresponding region is included in a computation of an XOR parity value for the corresponding XOR parity stripe.

(A4) In some embodiments of the method of A3, the method further includes storing the XOR parity table in the respective block.

(A5) In some embodiments of the method of any one of A2 to A4, the method further includes: after shutting-down the storage device and subsequently resuming operation of the storage device, while reading data from a respective block in which data was copied to the region contiguous to the identified boundary region in the respective block, using the data that was copied to the region contiguous to the identified boundary region to recover data that was unrecoverable from the identified boundary region.

(A6) In some embodiments of the method of A1, programming the data comprises writing a data pattern to the region that is contiguous to the identified boundary region. In some embodiments, the data pattern is similar to what might be written to dummy word-lines.

(A7) In some embodiments of the method of A6, the data pattern comprises a predefined dummy data pattern independent of data stored in the identified boundary region.

(A8) In some embodiments of the method of any one of A1 to A7, the method further includes: for a respective open block in the list, recording metadata identifying the region, contiguous to the identified boundary region.

(A9) In some embodiments of the method of any one of A1 to A8, the method further includes: recording, for a respective open block in the list, metadata indicating that the region, contiguous to the identified boundary region, is to be excluded from data compaction.

In some embodiments, the metadata identifies the last word line to which data was written prior to the shut-down request. Data stored in the region contiguous to the identified boundary region is not to be copied to another block during garbage collection, since it is a copy of the data in the identified boundary region, which will be copied if it is still valid data at the time of garbage collection.

(A10) In some embodiments of the method of any one of A1 to A9, the identified boundary region comprises one or more word lines or one or more pages.

(A11) In another aspect, a storage device includes non-volatile memory (e.g., one or more non-volatile storage devices, such as flash memory devices), a host interface, and a storage controller module. The storage controller module is configured to 1) receive, via the host interface, a shut-down request from a host device external to the storage device; and 2) in response to receiving the shut-down request: a) obtain a list of one or more open blocks (each having at least one unprogrammed word line); and b) for each block in the list of blocks: identify a boundary region of the block; and program data in a region that is contiguous to the identified boundary region.

(A12) In some embodiments of the storage device of A11, the storage controller module includes one or more processors and one or more controller modules executed by the one or more processors to perform a set of operations.

(A13) In some embodiments of the storage device of A12, the one or more controller modules include instructions for copying data in the identified boundary region to the region that is contiguous to the identified boundary region.

(A14) In some embodiments of the storage device of A13, the one or more controller modules include: storage device further includes: a command module configured to receive the shut-down request from the host device external to the storage device; a shut-down module configured to, in response to receiving the shut-down request: obtain the list of one or more open blocks, each having at least one unprogrammed word line; and for each block in the list of blocks: identify a boundary region of the block; and initiate programming data in the region that is contiguous to the identified boundary region; and a programming module configured to program data in a specified region of a specified block.

(A15) In some embodiments of the storage device of A14, the one or more controller modules further include an XOR parity bitmap table generator, wherein: XOR parity bitmap table generator is configured to update, in response to the shut-down request, for a respective open block in the list, an XOR parity bitmap table for the open block, wherein a table entry in the XOR parity table corresponds to an XOR parity stripe; the table entry includes a plurality of bits, and each bit corresponds to a distinct region in the respective open block and indicates whether the corresponding region is the region contiguous to the identified boundary region of the respective open block.

(A16) In some embodiments of the storage device of A15, the one or more controller modules include instructions to store the XOR parity table in the respective open block in response to the shut-down request.

(A17) In some embodiments of the storage device of any one of A10 to A13, wherein the one or more controller modules include a data reuse module, and the data reuse module is configured to use the data that was copied to the region contiguous to the identified boundary region of a respective block, in the list of blocks, to recover data stored in the identified boundary region of the respective block. For example, the data reuse module may be used to recover data after shutting-down the storage device and subsequently resuming operation of the storage device, while reading data from a respective block in which data was copied to the region contiguous to the identified boundary region in the respective block.

(A18) In some embodiments of the storage device of A12, wherein the one or more controller modules include instructions for writing a data pattern to the region that is contiguous to the identified boundary region.

(A19) In some embodiments of the storage device of A18, wherein the data pattern comprises a predefined dummy data pattern independent of data stored in the identified boundary region.

(A20) In some embodiments of the storage device of any one of A11 to A19, wherein the one or more controller modules include instructions for recording metadata, for a respective open block in the list, identifying the region, contiguous to the identified boundary region.

(A21) In some embodiments of the storage device of any one of A11 to A20, wherein the one or more controller modules include instructions for recording metadata, for a respective open block in the list, indicating that the region, contiguous to the identified boundary region, is to be excluded from data compaction.

(A22) In some embodiments of the storage device of any one of A11 to A20, wherein the identified boundary region comprises one or more word lines or one or more pages.

(A24) In yet another aspect, a non-transitory computer-readable storage medium stores one or more programs configured for execution by one or more processors of a storage device, the one or more programs for causing the storage device to perform the method of any of A1 to A10.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

FIG. 1 is a diagram of an implementation of a data storage environment, namely data storage environment 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, data storage environment 100 includes data processing system 110, and storage device 120.

Data processing system 110 is coupled to storage device 120 through data connections 101. Those skilled in the art will appreciate from the present disclosure that in various implementations data processing system 110 includes storage device 120 as a component. Generally, data processing system 110 includes any suitable computer device, such as a computer, a laptop computer, a tablet device, a netbook, an internet kiosk, a personal digital assistant, a mobile phone, a smart phone, a gaming device, a computer server, or any other computing device. In some implementations, data processing system 110 includes one or more processors, one or more types of memory, a display and/or other user interface components such as a keyboard, a touch screen display, a mouse, a track-pad, a digital camera and/or any number of supplemental devices to add functionality.

Storage device 120 includes a storage medium 132 coupled to storage controller 124 through data connections 103. Those skilled in the art will appreciate from the present disclosure that in various implementations storage controller 124 and storage medium 132 are included in the same device (e.g., storage device 120) as constituent components thereof, while in other embodiments storage controller 124 and storage medium 132 are, or are in, separate devices. Storage medium 132 includes any number (i.e., one or more) of memory devices including, without limitation, non-volatile semiconductor memory devices, such as flash memory. For example, flash memory devices can be configured for enterprise storage suitable for applications such as cloud computing. Additionally, and/or alternatively, flash memory devices can also be configured for relatively smaller-scale applications such as personal flash drives or hard-disk replacements for personal, laptop and tablet computers. In some implementations, storage medium 132 comprises one or more flash memory devices. In some implementations, storage medium 132 comprises at least one of NAND-type flash memory and NOR-type flash memory.

Storage mediums are often divided into a number of addressable and individually selectable blocks, such as selectable portion 133. In some implementations, for flash memory, the individually selectable blocks are the minimum erasable units in a flash memory device. In other words, each block contains a minimum number of memory cells that can be erased simultaneously. Each block is usually further divided into a plurality of pages, where each page is typically an instance of a minimum unit of the smallest individually accessible sub-block in the block. However, in some implementations (e.g., in some types of flash memory), the minimum unit of individually accessible data is a sector, which is a subset of a page. That is, each page contains a plurality of sectors and each sector is the minimum unit of individually accessible data for writing data to or reading data from the flash memory device.

For the sake of notation only, a block of data includes a plurality of pages, typically a fixed number of pages per block, and each page includes a plurality of sectors, typically a fixed number of sectors per page. For example, in some implementations, one block includes 64 pages, 128 pages, 256 pages, or another suitable number of pages. The respective sizes of blocks, pages and sectors are often a matter of design choice or end-user choice, and are often differ across a wide range of enterprise and consumer devices. However, for example only, and without limitation, in some enterprise applications a page includes 2K (i.e., 2048) to 16K bytes, and a sector includes anywhere from 256 bytes to 544 bytes. Those range may be extended upward or downward, and/or shrink or expand depending on a particular application. In some embodiments, each page stores one or more codewords, where a codeword is the smallest unit of data that is separately encoded and decoded by the encode and decoder mechanisms of a particular device.

In some implementations, memory controller 124 includes management module 121, error control module 125, storage medium interface (I/O) 128 and host interface 129. Host interface 129 couples storage device 120 and its storage controller 124 to one or more computer systems 110, while storage medium interface 128 coupled storage controller 124 to storage medium 132. Those skilled in the art will appreciate from the present disclosure that storage controller 124 includes various additional features that have not been illustrated for the sake of brevity, and so as not to obscure more pertinent features of the example implementations disclosed herein, and that a different arrangement of features may be possible.

Host interface typically includes data buffers (not shown) to buffer data being received and transmitted by storage device 120, via data connections 101. Similarly, storage medium I/O 128 provides an interface to storage medium 132 though data connections 103. In some implementations, storage medium interface 128 includes read and write circuitry.

In some implementations, management module 121 includes one or more processors 122. However, those skilled in the art will appreciate from the present disclosure that, in some implementations, processor 122 is shared by one or more components within, and in some cases, beyond the function of storage controller 124. Management module 121 is coupled to host interface 129, error control module 125 and storage medium I/O 128 in order to coordinate the operation of these components.

Error control module 125 is coupled between storage medium I/O 128 and host interface 129. In some implementations, error control module 125 is provided to limit the number of uncorrectable errors inadvertently introduced into data. To that end, error control module 125 includes encoder 126 and decoder 127. Encoder 126 encodes data to produce a codeword which is subsequently stored in storage medium 132. When the encoded data is read from storage medium 132, decoder 127 applies a decoding process to recover the data, and correct errors within the error correcting capability of the error control code. Those skilled in the art will appreciate from the present disclosure that various error control codes have different error detection and correction capacities, and that particular codes are selected for various applications for reasons beyond the scope of this disclosure.

Figure 2:
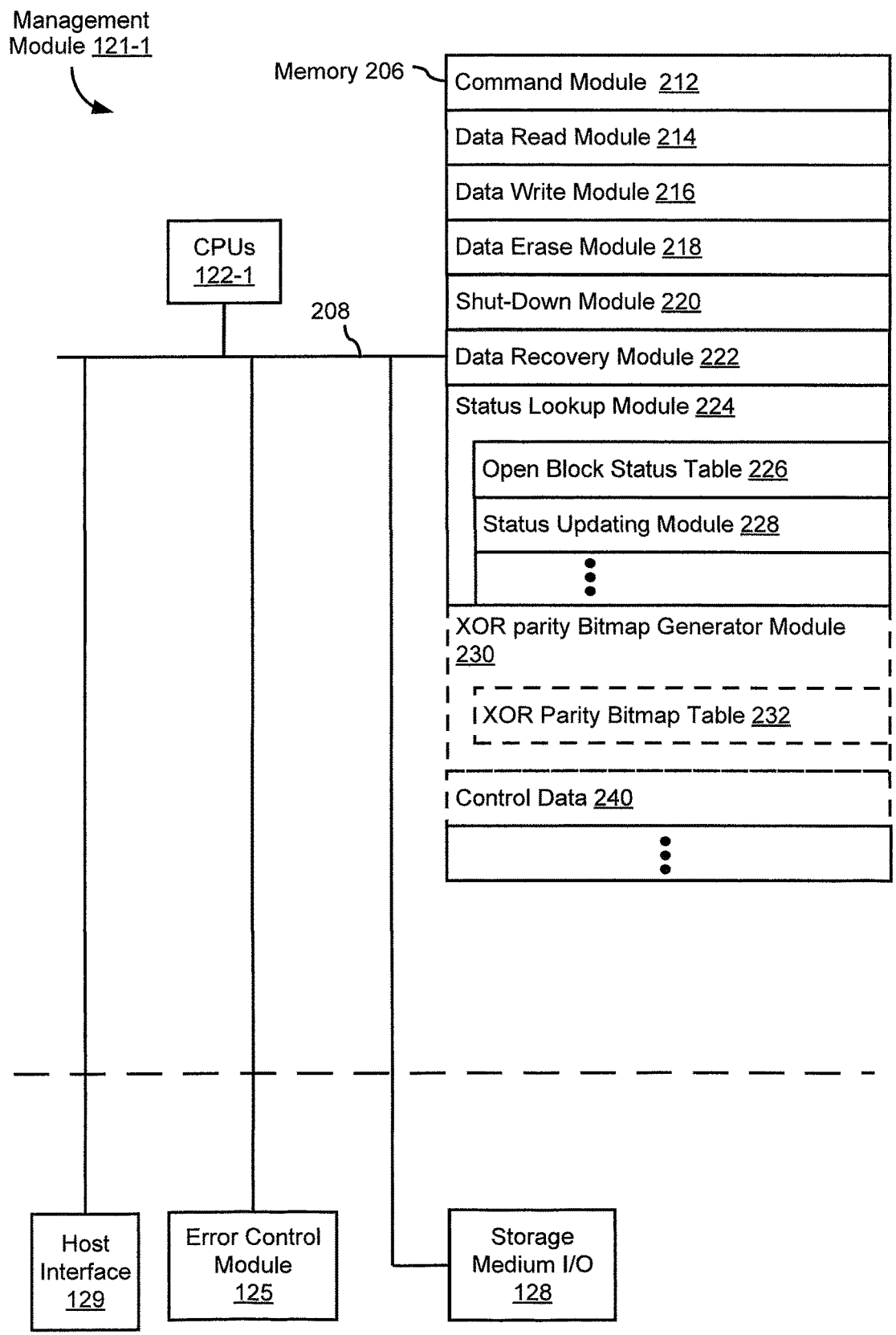
FIG. 2 is a block diagrams illustrating a management module in accordance with some embodiments.

FIG. 2 illustrates a block diagram of management module 121 in accordance with some embodiments. Management module 121 typically includes: one or more processors 122 (sometimes herein called CPUs, processing units, hardware processors, processors, microprocessors or microcontrollers) for executing modules, programs and/or instructions stored in memory 206 and thereby performing processing operations. Management module 121 also includes memory 206 (sometimes herein called controller memory), and one or more communication buses 208 for interconnecting these components. Communication buses 208 optionally include circuitry (sometimes called a chipset) that interconnects and controls communications between system components. Management module 121 is coupled by communication buses 208 to storage medium interface 128, error control module 125, and host interface 129. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the one or more processors 122. Memory 206, or alternatively the non-volatile memory device(s) within memory 206, comprises a non-transitory computer readable storage medium. In some embodiments, memory 206, or the non-transitory computer readable storage medium of memory 206, stores the following programs, modules, and data structures, or a subset or superset thereof:

command module (sometimes called an interface module) 212 for receiving or accessing a host command specifying an operation to be performed and a logical or physical address corresponding to a selectable portion 133 or storage medium 132 within the storage device 120 (FIG. 1);

data read module 214 for reading data from storage medium 132 (e.g., non-volatile memory);

data write module 216 for writing data to storage medium 132;

data erase module 218 for erasing data in storage medium 132;

shut-down module 220 for processing a shut-down request from an external host device;

data recovery module 222 for recovering data unrecoverable from boundary regions of an open block;

status lookup module 224 that is used for monitoring open blocks (e.g., open erase blocks) within memory portions 133 of storage device 120, optionally including:

open block status table 226 that is used for storing information about the status of open blocks and information about predefined portions within each open block (e.g., information identifying a location within each open block corresponding to a last written word line);

status updating module 228 for adding, updating and/or removing information about the status of open blocks (and predefined portions of the open blocks) within storage device 120 that are being monitored by status lookup module 224 (e.g., updating last written word line information for a particular open block in conjunction with data write module 216 performing a write operation at the particular open block, or removing information with respect to a particular erase block in conjunction with closing the particular erase block).

XOR parity bitmap generator module 230 that is used to generate an XOR parity table 232 for an open block. Each entry in the XOR parity table 232 corresponds to an XOR parity stripe and includes a plurality of bits, and each bit corresponds to a distinct region in the respective open block. In some embodiments, each bit indicates whether the corresponding region is the region contiguous to the identified boundary region of the respective open block. In some embodiments, each bit of the XOR parity table entry 232 indicates whether data, if any, stored in the corresponding region is included in a computation of an XOR parity value for the corresponding XOR parity stripe;

control data 240, examples of which are described below.

Further information regarding the modules and data structures listed above is provided in the following discussions. Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the non-transitory computer readable storage medium of memory 206, provide instructions for implementing any of the methods described below with reference to FIGS. 4A-4C. Stated another way, the programs or modules stored in memory 206, when executed by the one or more processors 122, cause storage device 120 to perform any of the methods described below with reference to FIGS. 4A-4C.

Although FIG. 2 shows a management module 121, FIG. 2 is intended more as functional description of the various features which may be present in a management module than as a structural schematic of the embodiments described herein. In practice, and as recognized by those of ordinary skill in the art, the programs, modules, and data structures shown separately could be combined and some programs, modules, and data structures could be separated.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the non-transitory computer readable storage medium of memory 206, provide instructions for implementing some of the methods described below. In some embodiments, some or all of these modules may be implemented with specialized hardware circuits that subsume part or all of the module functionality.

Figure 3A:
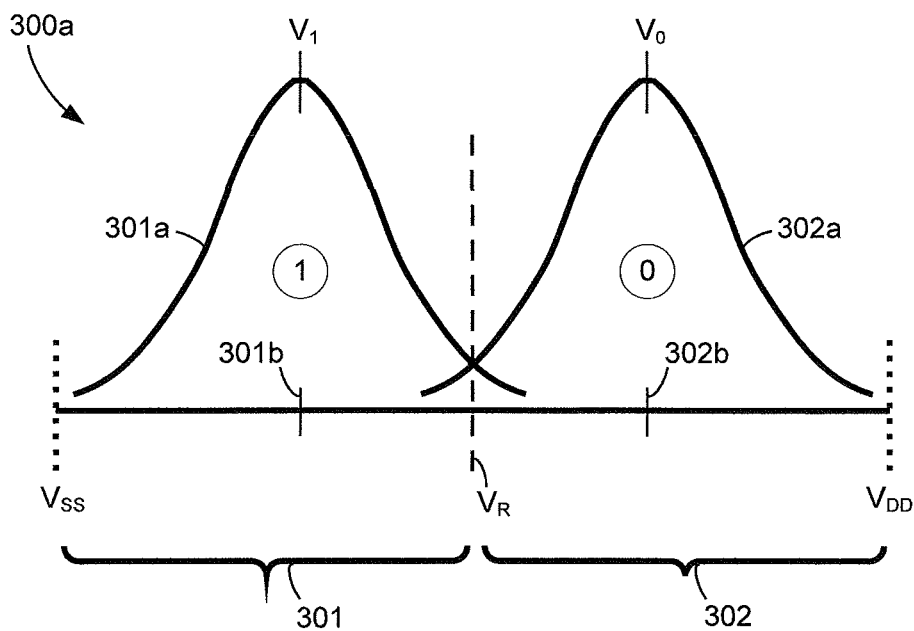
FIG. 3A is a simplified, prophetic diagram of voltage distributions 300a found in a single-level flash memory cell (SLC) over time, in accordance with some embodiments.

FIG. 3A is a simplified, prophetic diagram of voltage distributions 300a found in a single-level flash memory cell (SLC) over time, in accordance with some embodiments. The voltage distributions 300a shown in FIG. 3A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 300a extend between $V_{SS}$ and $V_{DD}$.

Sequential voltage ranges 301 and 302 between source voltage $V_{SS}$ and drain voltage $V_{DD}$ are used to represent corresponding bit values "1" and "0," respectively. Each voltage range 301, 302 has a respective center voltage $V_1$ 301b, $V_0$ 302b. As described below, in many circumstances the memory cell current sensed in response to an applied reading threshold voltage is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell. As discussed below with reference to FIG. 3B, a MLC flash memory device is used to store multiple bits by using voltage ranges within the total voltage range of the memory cell to represent different bit-tuples. A MLC flash memory device is typically more error-prone than a SLC flash memory device created using the same manufacturing process because the effective voltage difference between the voltages used to store different data values is smaller for a MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 3B, the impact of such errors can be reduced by gray-coding the data, such that adjacent voltage ranges represent single-bit changes between bit-tuples.

Figure 3B:
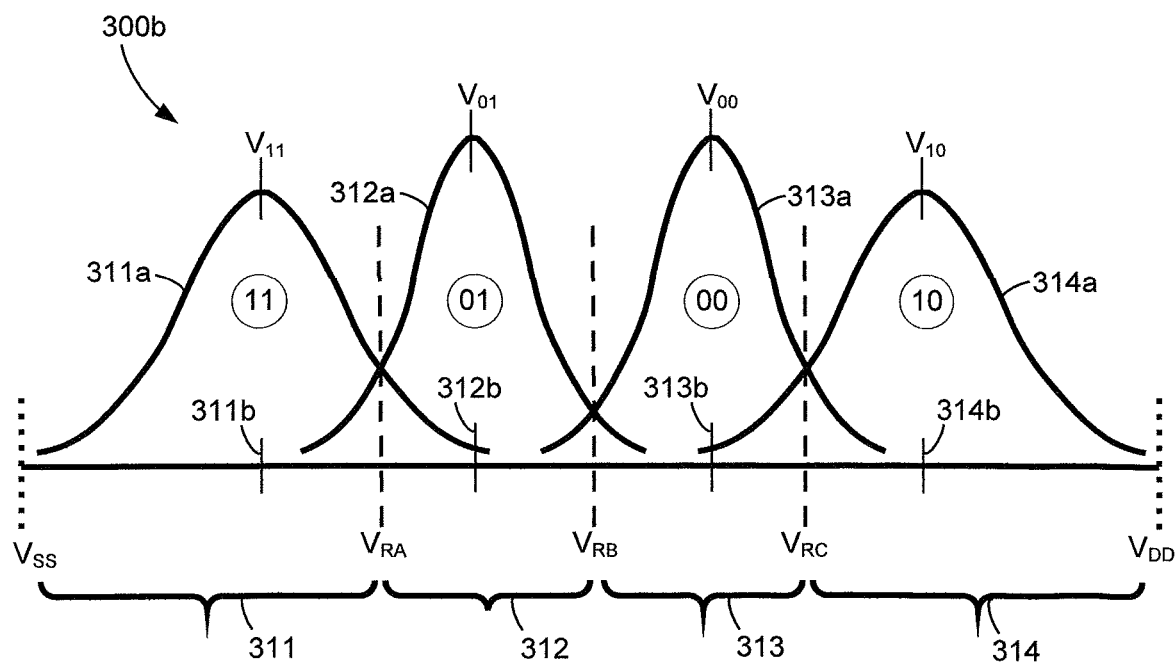
FIG. 3B is a simplified, prophetic diagram of voltage distributions 300b found in a multi-level flash memory cell (MLC) over time, in accordance with some embodiments.

FIG. 3B is a simplified, prophetic diagram of voltage distributions 300b found in a multi-level flash memory cell (MLC) over time, in accordance with some embodiments. The voltage distributions 300b shown in FIG. 3B have been simplified for illustrative purposes. The cell voltage of a MLC approximately extends from a voltage, $V_{SS}$, at the source terminal of a NMOS transistor to a voltage, $V_{DD}$, at the drain terminal. As such, voltage distributions 300b extend between $V_{SS}$ and $V_{DD}$.

Sequential voltage ranges 311, 312, 313, 314 between the source voltage $V_{SS}$ and drain voltages $V_{DD}$ are used to represent corresponding bit-tuples "11," "01," "00," "10," respectively. Each voltage range 311, 312, 313, 314 has a respective center voltage 311b, 312b, 313b, 314b. Each voltage range 311, 312, 313, 314 also has a respective voltage distribution 311a, 312a, 313a, 314a that may occur as a result of any number of a combination of factors, such as electrical fluctuations, defects in the storage medium, operating conditions, device history (e.g., number of program-erase (P/E) cycles), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311b, $V_{01}$ 312b, $V_{00}$ 313b and $V_{10}$ 314b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311b, $V_{01}$ 312b, $V_{00}$ 313b or $V_{10}$ 314b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

Although the description of FIG. 3B uses an example in which q=2 (i.e., 2 bits per cell in a MLC flash memory), those skilled in the art will appreciate that the embodiments described herein may be extended to memory cells that have more than four possible states per cell, yielding more than two bits of information per cell. For example, in some embodiments, a triple-level memory cell (TLC) has eight possible states per cell, yielding three bits of information per cell. As another example, in some embodiments, a quad-level memory cell (QLC) has 16 possible states per cell, yielding four bits of information per cell. As another example, in some embodiments, a cell might store only 6 states, yielding approximately 2.5 bits of information per cell, meaning that two cells together would provide 36 possible states, more than sufficient to store 5 bits of information per pair of cells.

In some embodiments, the last written portion (e.g., word line) of an erase block is not as "fully written" as previously written word lines, due to the impact that writing data on word line has on the voltage distributions of data stored in a neighboring word line. As result, in some embodiments, more accurate read operations (e.g., lower error read operations) for reading data from the last written portion of an erase block, sometimes herein called a boundary region, can be performed by using one or more reading thresholds $V_R$ that are lower (shifted to the left, in FIG. 3A or 3B) than the default reading thresholds used to read other data in the same erase block.

Figures 3C, 3D:
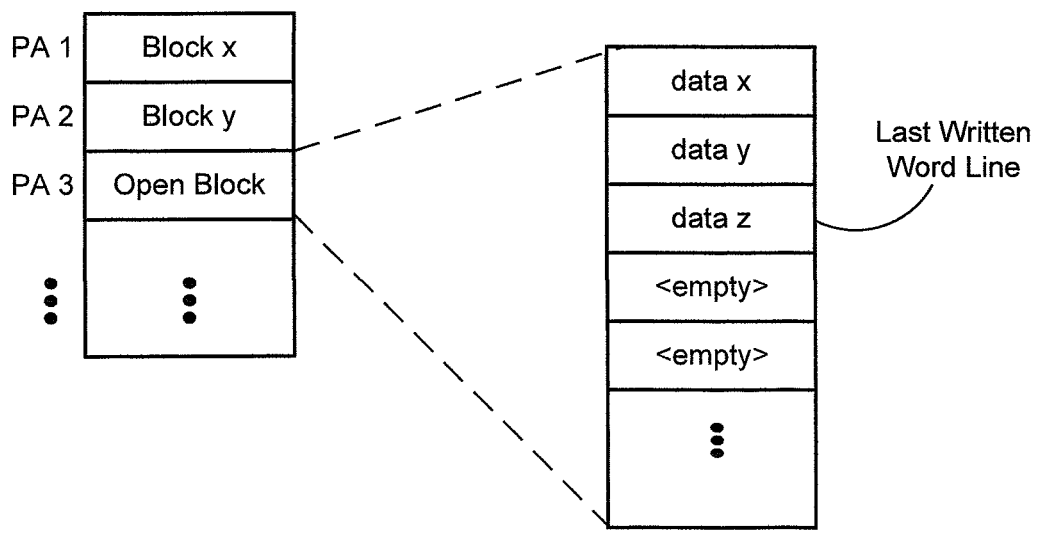
FIG. 3C is a block diagram illustrating a status table and, more specifically, an open block status table, in accordance with some embodiments.
FIG. 3D is a block diagram illustrating a memory portion and, more specifically, a memory portion with an open block.

FIG. 3C is a block diagram illustrating a status table and, more specifically, an open block status table, in accordance with some embodiments. In some embodiments, one or more open block status tables (e.g., open block status table 224 and/or open block status table 254) are used to store information about the status of open blocks in a storage device and information about predefined portions within each open block (e.g., information identifying a location within each open block corresponding to a last written word line).

For example, as illustrated in FIG. 3C, an open block status table contains records 316-1 through 316-z and optionally contains a header 316-0. Header 316-0, in some embodiments, contains a brief description of each field of information (e.g., each field of the database records) stored within the open block status table. In this non-limiting example, header 316-0 contains fields for "Block ID" (e.g., a block identifier, such as a physical address within a storage device or a pointer to the physical address) and "Last Written Word Line ID" (e.g., a word line identifier, such as a physical address of a predefined portion of an erase block that is an open erase block or a pointer to the physical address). In some embodiments, each record 316-1 through 316-z contains one or more additional fields, such as a "timestamp" field that identifies when the last write command was performed at the open erase block associated with each record, a "read parameters" field that includes a data structure or object (or a pointer to a data structure or object, such as a pointer to an object stored within memory operation parameters 232 and/or memory operation parameters 262) containing one or more memory operation parameters for reading data from the last written word line associated with each record, and/or a "last written by" field that identifies a component of data storage system 100 (FIG. 1A or 1B) that initiated the last write command (e.g., a host, such as computer system 110, or a module within a storage device, such as garbage collection module 210 of management module 121-1).

In some embodiments, information indicating the number of data bits stored per memory cell (e.g., SLC (one bit per cell), MLC (two bits per cell), or TLC (three bits per cell), in each open block is indicated by an additional field of the corresponding respective memory. Alternatively, information indicating the number of data bits stored per memory cell in each block is stored in a different status table or management data structure (not shown) of the storage device's storage controller.

As pictured in FIG. 3C, records 316-1 through 316-z contain open block status information corresponding to erase blocks in a storage device. In some embodiments, a single open block status table (e.g., open block status table 224) contains open block status information for all erase blocks in a storage device.

Continuing with the example pictured in FIGS. 3C and 3D, Record 316-1 indicates that an erase block located at physical address 3 (e.g., PA 3 of memory portion 320, FIG. 3D) is an open erase block (i.e., an erase block containing empty/unwritten portions, as illustrated by the "<empty>" portions of PA 3 within memory portion 320, FIG. 3D) that has a last written word line "WL 2" (e.g., a last written word line is a predefined portion (in some embodiments, 1, 2 or 3 pages) of the memory portion 320. In this example, the word line specified by Record 316-1 is the last portion of the specified memory portion with written data and all predefined portions of the specified memory portion that follow the last written word line are empty/unwritten.

In some embodiments, the block identifier in each record 314 (e.g., "PA 3" in Record 316-1) is a physical address that indicates a location of the open erase block in a non-volatile storage device. In other embodiments, the block identifier is a relative physical address, also called an offset, that indicates that the physical address of the open erase block associated with the record 314 is offset from an initial physical address (e.g., a first physical address representing the location at which the erase blocks on a particular non-volatile memory die begin) by a specified number of erase blocks. In some embodiments, the word line identifier (e.g., "WL 2") in each record 314 is an identifier (such as a physical address, also called an offset or relative physical address or local physical address, that indicates where the word line begins within the open erase block, e.g., a physical address that identifies the location of a first page of the word line) for a predefined portion of an open erase block. In some other embodiments, the block identifier and word line identifier in a respective record 314 contain pointers to the physical addresses (or to the first physical addresses) of the open erase block and the last written word line of the open erase block, respectively.

Each record contained within the open block status table is maintained by a status lookup module (e.g., status lookup module 224, FIG. 2) and/or a status updating module (e.g., status updating module 228, FIG. 2) in a storage controller. For example, in accordance with a determination (e.g., by data write module 216 or data write module 248) that data being written (or already written) to an erase block will leave one or more predefined portions (e.g., word lines) in an unwritten state (in other words, the data is not of a large enough size to fill all predefined portions within the erase block and, thus, one or more of the predefined portions will not be updated during/after the write operation), then the status updating module will add a record to the open block status table that identifies the erase block that is now an open erase block and the last written word line of the open erase block. Furthermore, in accordance with a determination (e.g., by data write module 216) that a write command will close (or already did close) an open erase block, the status updating module removes information associated with the open erase block from the open block status table (e.g., by deleting a record from the open block status table, or marking the record as inactive or invalid, or erasing information in the record, or replacing information in the record with null information).

Additionally, in some embodiments, in accordance with a determination (e.g., by data erase module 218) that an erase operation (or a garbage collection operation that includes an erase operation) is for an open erase block, then the status updating module will remove information associated with the open erase block from the open block status table (e.g., using any of the methodologies described above). In some embodiments, updating of the open block status table is performed (e.g., scanning the open block status table to locate a record that requires an update and performing the required update on the record) after completion of a memory operation (e.g., a write or erase operation), so that the execution time of the memory operation is unaffected by the time required to update the open block status table.

In some embodiments, one data structure (e.g., one table, database, linked list, text file, etc.) is used to store information about all open erase blocks in a particular storage medium (e.g., storage medium 132, FIG. 1). For example, open block status table 224 is used, in these embodiments, to store status information about all open erase blocks in storage medium 132. In some embodiments, only information about open erase blocks in active portions of the particular storage medium (e.g., active superblocks) is stored in the open block status table.

In some embodiments, the data structures discussed above (e.g., open block status table 226) contain a record for all erase blocks (i.e., not just the open erase blocks) that are part of a particular storage medium in a storage device (e.g., storage medium 132, FIG. 1). In these embodiments, each record in the open block status table indicates whether an erase block is an open erase block by the value stored in the "Last Written Word Line ID" field (e.g., only the erase blocks associated with records that contain a non-null value for the last written word line are open erase blocks). Alternatively, in these embodiments, the open block status table contains an additional field, such as an "Open Block?" flag, which is used to indicate whether each record is associated with an erase block that is an open erase block (e.g., a "True" or "1" value indicates that the erase block is an open erase block and a "False" or "0" value indicates that the erase block is not an open erase block).

FIG. 3E illustrates open block boundary region data padding at host shutdown request. In this example, boundary region 320 of block 322 consists of two last written pages (e.g., pages 6 and 7 in this example) and a block has four XOR parity stripes, labeled X0, X1, X2 and X3 in FIGS. 3E and 3F. For example, the X0 parity stripe includes pages 0, 4, 8 and 12; the X1 parity stripe includes pages 1, 5, 9 and 13; etc. XOR parity stripes are described in more detail below. Furthermore, in this example, prior to receiving a shutdown request, data has been written to pages 0-7 of block 322, but no data has been written to pages 8-15. Pages 8-15 are sometimes called erased pages, since the last operation performed on those pages was an erase operation, which erased all data in block 322.

In some embodiments, upon receiving a host request to shut down the drive (e.g., StandbyImmediate for SATA SSD and NVMeShutdownNotification for NVMe SSD), system firmware (e.g., shut-down module 220 and/or status lookup module 124 of management module 121-1) has all the information about the open blocks and their boundary regions that are susceptible to data reliability issues. In some embodiments, open blocks that store only one bit per cell, sometimes called SLC blocks, are not susceptible to boundary region data reliability issues, and therefore only other open blocks (e.g., MLC and/or TLC blocks) are identified as being susceptible to boundary region data reliability issues.

In some embodiments, as part of the shutdown request handling procedure, system firmware reads all data in the boundary regions of all relevant open blocks (e.g., those open blocks most susceptible to data reliability issues), and programs a copy of the data in the boundary regions 320 to regions 324 neighboring the boundary regions of these open blocks. In the example shown in FIG. 3E, data in boundary region 320, i.e., in pages 6 and 7, is read and a copy is written to pages 8 and 9, which together comprise the region 324 neighboring the boundary region. Region 324 is sometimes herein called a contiguous region, as it is contiguous with boundary region 320.

In some embodiments, if a flash memory technology also shows worse data reliability at boundary regions of a closed block, similar data padding can be applied to the dummy word lines (not shown in the figures) of the block, so that the original boundary regions are no longer physical boundary regions. In some embodiments, the data pattern programmed into the dummy word lines is different from the data in the original boundary region, and could be a predefined data pattern, thereby avoiding overhead that would be associated with generating the data pattern.

In some embodiments, information indicating that there is a second copy of the boundary region data is stored as part of the system's control data. In the example shown in FIG. 3E, information that the data in boundary region 320 has been copied to the neighboring region 324 (e.g., a region contiguous to the boundary region, sometimes herein called the contiguous region or padded region) of the same open block, is stored in system's control data (e.g., as shown in FIG. 2, control data 240). In some embodiments, the information about the copy is used to recover data that was otherwise unrecoverable from the boundary region. Furthermore, in some embodiments, the information about the copy is used in later compaction of blocks and the copy of the boundary region data is excluded from compaction relocation.

In some embodiments, instead of programming the contiguous region with a copy of data in the boundary region, the contiguous region is programmed with a predefined data pattern. In some embodiments, the predefined data pattern is determined or generated ahead of time, rather than at the time of processing a shutdown request, thereby saving time during shutdown. In some embodiments, the predefined data pattern is the same as, or similar to, the data pattern written to dummy work lines.

FIG. 3F illustrates two XOR parity tables, including XOR parity table 330 for a block 322 with padded data and XOR parity table 332 for a block 334 without padded data. Each of the blocks in this example has 16 pages for storing data and four XOR parity stripes, similar to what is shown in FIG. 3E. It is noted that block 322, as shown in FIG. 3F, represents a state of block 322 after four additional pages of data have been written to block 322 (e.g., pages 10-13 of block 322), subsequent to the processing of a first shutdown request that resulted in block 322 being in the state shown in FIG. 3E, and furthermore after the processing of a second shutdown request has resulted in data being copied from a second boundary region 336 (e.g., pages 12 and 13) to a second contiguous region 338 (e.g., pages 14 and 15).

In the example shown on the left side of FIG. 3F, XOR parity table 332 reflects the state of block 334 without padding: XOR parity table 332 includes four bitmaps, including one for each of the four parity stripes X0, X1, X2 and X3 equals 1111b. A bit value of 1 indicates that a given page (e.g., pages 0, 4, 8 and 12 in the case of parity stripe X0; pages 1, 5, 9 and 13 in the case of parity stripe X1; pages 2, 6, 10 and 14 in the case of parity stripe X2; and pages 3, 7, 11 and 15 in the case of parity stripe X3) should be included in calculation of the XOR parity for the corresponding parity stripe.

In the example shown on the right side of FIG. 3F, XOR parity table 330 (including four bitmaps for four parity stripes) reflects the state of block 332 with padding, after two shutdowns and two sets of padding (e.g., pages 8 and 9 after the first shutdown, and pages 14 and 15 after the second shutdown). For this example, the parity bitmap value of 1011b for parity stripe X0 indicates that pages 0, 4 and 12 need to be included and page 8 needs to be excluded from the calculation of XOR parity for parity stripe X0. Similarly, in this example, the parity bitmap value of 1011b for parity stripe X1 indicates that pages 1, 5 and 13 need to be included and page 9 needs to be excluded from the calculation of XOR parity for parity stripe X1. In comparison, for this example, the parity bitmap value of 0111b for parity stripe X2 indicates that pages 2, 6 and 10 need to be included and page 14 needs to be excluded from the calculation of XOR parity for parity stripe X2. Similarly, in this example, the parity bitmap value of 0111b for parity stripe X3 indicates that pages 3, 7 and 11 need to be included and page 15 needs to be excluded from the calculation of XOR parity for parity stripe X3.

Figure 4A:
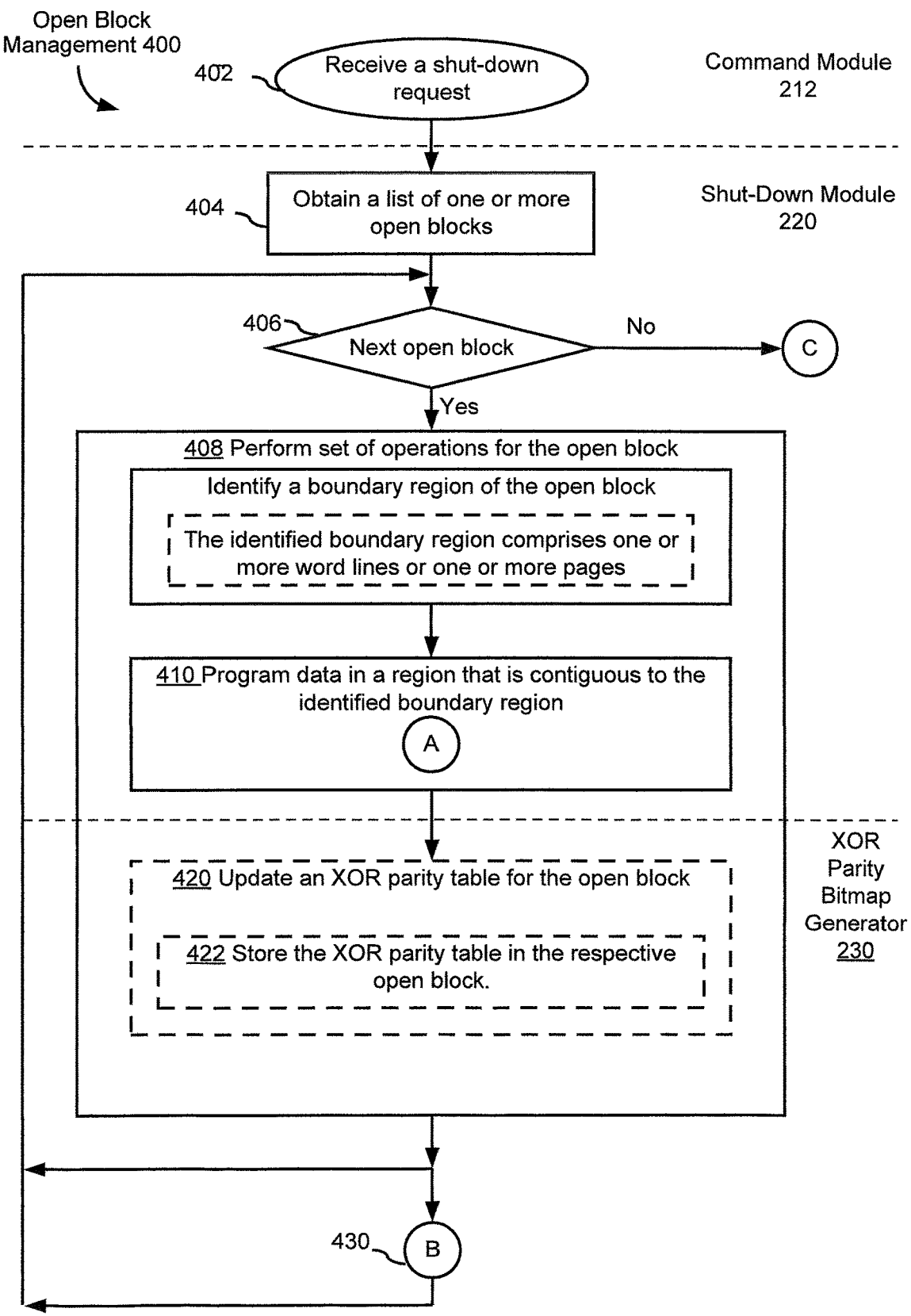
FIGS. 4A-4C illustrate flowchart representations of methods of open block management in a storage device, in accordance with some embodiments.
Figure 4B:
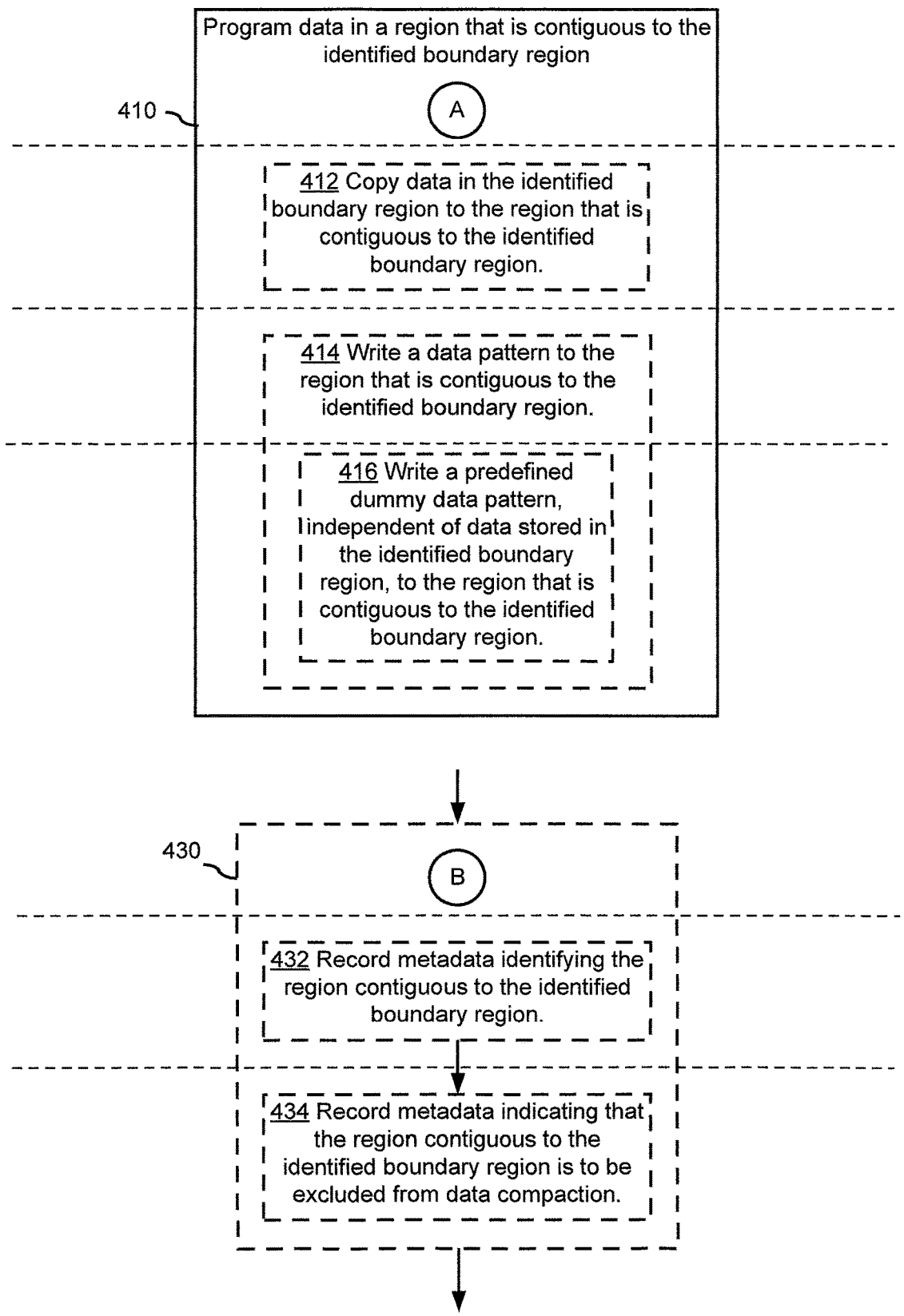
Figure 4C:
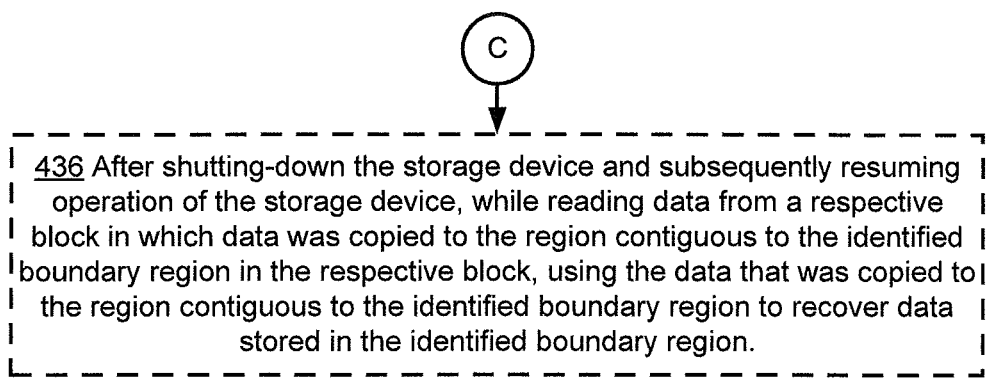

FIGS. 4A-4C illustrate a flowchart representation of a method of open block management within a storage system, in accordance with some embodiments. With reference to the data storage systems 100 pictured in FIG. 1, in some embodiments, open block management method 400 is performed by a storage device (e.g., storage device 120, FIG. 1) or one or more components of the storage device (e.g., storage controller 124). In some embodiments, the storage device is operatively coupled with a host system (e.g., computer system 110). In some embodiments, open block management method 400 is governed by instructions that are stored in a non-transitory computer-readable storage medium and that are executed by one or more processors of a device, such as the one or more processing units (CPUs) 122-1 of management module 121-1.

In some embodiments, some of the operations of open block management method 400 are performed at a host (e.g., computer system 110) and other operations of method 400 are performed at a storage device (e.g., storage device 120). In some embodiments, open block management method 400 is governed, at least in part, by instructions that are stored in a non-transitory computer-readable storage medium and that are executed by one or more processors of a host (not shown in FIG. 1).

For ease of explanation, the following describes open block management method 400 as performed by a storage device (e.g., by storage controller 124 of storage device 120, FIG. 1). With reference to FIG. 2, in some embodiments, the operations of method 400 are performed, at least in part, by a data read module 214, a status lookup module 224, a shut-down module 220, and an XOR parity bitmap generator 230. However, those skilled in the art will appreciate that in other embodiments, one or more of the operations described in open block management method 400 are performed by a host (e.g., computer system 110), and/or by a different combination or set of modules.

Open block management method 400 begins, in some embodiments, when the storage device receives (402) a shut-down request (e.g., a request to power off the storage device) from a host external to the storage memory device. In response to receiving the shut-down request, in some embodiments, the storage device obtains (404) a list of one or more open blocks (e.g., records 316-0, 316-1, . . . , 316-z in the open block status table 226, as illustrated in FIG. 3C). In some embodiments, the list of open blocks lists two or more open blocks. In some embodiments, the list of one or more open blocks excludes open blocks configured to store only one bit of data per memory cell (e.g., blocks in which the memory cells are flash memory cells configured as SLC memory cells).

Then for each of the open blocks (406), in some embodiments, the storage device performs at least two operations (408): (1) identify a boundary region of the open block, which in some embodiments comprises one or more word lines or one or more pages; and (2) program data (410) in a region that is contiguous to the identified boundary region. In some embodiments, as illustrated in FIG. 3C, the storage device uses the last written world line ID in the open block status table 226 to identify the boundary regions of the open block.

In some embodiments, the storage device programs data (410), in a region (e.g., region 324 with pages 8 and 9 in FIG. 3E) that is contiguous to the identified boundary region (e.g., region 320 with pages 6 and 7 in FIG. 3E), either by copying (412) data in the identified boundary region to the region that is contiguous to the identified boundary region (as illustrated in FIGS. 3E and 3F), or by writing (414) a data pattern to the region that is contiguous to the identified boundary region. In some embodiments, the storage device writes a data pattern (not shown) that includes a predefined dummy data pattern (416), independent of data stored in the identified boundary region. In some embodiments, the storage device obtains or computes the data pattern ahead of receiving a shutdown request (not shown).

In some embodiments, the open block management method further includes the storage device updating (420) an XOR parity table (e.g., XOR parity table 332 in FIG. 3F) for the open block, as illustrated in FIG. 3F and as described above. Further, in some embodiments, the storage device stores (422) the XOR parity table (e.g., XOR parity table 330 in FIG. 3F), such as in the respective open block (e.g. storing XOR parity table 330 in block 322 in FIG. 3F), in the metadata of one or more codewords, or in specific control data structures (e.g., control data 240, FIG. 2) for the blocks on the drive.

In some embodiments, as illustrated in FIGS. 4A and 4B by 430, the open block management method further includes: (1) recording (432) metadata (not shown) identifying the region (e.g., region 338 in FIG. 3F) contiguous to the identified boundary region (e.g., region 336 in FIG. 3F); or (2) recording (434) metadata (not shown) indicating that the region contiguous to the identified boundary region is to be excluded from data compaction. In some embodiments, the metadata identifies the last word line to which data was written prior to the shut-down request. Data stored in the region contiguous to the identified boundary region is not to be copied to another block during garbage collection, since it is a copy of the data in the identified boundary region, which will copied if it is still valid data at the time of garbage collection. In some embodiments, such metadata is stored in open block status table 226, or control data 240, or the like.

In some embodiments, as illustrated in FIG. 4C by 436, the open block management method further includes: after shutting-down the storage device and subsequently resuming operation of the storage device, while reading data from a respective block in which data was copied to the region contiguous to the identified boundary region in the respective block, using the data that was copied to the region contiguous to the identified boundary region to recover data stored in the identified boundary region that was unrecoverable from (i.e., using only data stored in) the identified boundary region. For example, in some embodiments, for the block in FIG. 3F, to recover data in page 6, 7, 12 or 13, respectively, the data in page 8, 9, 14 or 15, will be used. More specifically, in some embodiments, if data in a specified page such as page 6, 7, 12 or 13 (i.e., in a boundary region of a respective block) cannot be successfully decoded using the error correction codes stored in those pages, and further more cannot be recovered using the corresponding XOR parity stripe, then an attempt is made to read the corresponding page (e.g., page 8, 9, 14 or 15) in the region contiguous to the boundary region that contains the specified page, and to use the data from the corresponding page as the data for the specified page. Typically if such a recovery process is required, the recovered data will be stored in another block or another available storage location in the storage device.

It will be understood that, although the terms "first," "second," etc. may be used herein to describe various elements, these elements should not be limited by these terms. These terms are only used to distinguish one element from another. For example, a first transistor could be termed a second transistor, and, similarly, a second transistor could be termed a first transistor, without changing the meaning of the description, so long as all occurrences of the "first transistor" are renamed consistently and all occurrences of the "second transistor" are renamed consistently. The first transistor and the second transistor are both transistors, but they are not the same transistor.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of managing a storage device, comprising:
   receiving at the storage device, from a host device external to the storage device, a shut-down request, the storage device including a plurality of non-volatile memory blocks; and
   in response to receiving the shut-down request:
      obtaining a list of one or more open blocks, each open block having at least one un-programmed word line, each open block including a boundary region corresponding to a last written portion, and a non-boundary region comprising one or more written pages or one or more written word lines; and
      for each open block in the list of open blocks:
         identifying the boundary region of the block; and
         programming data in a region that is contiguous to the identified boundary region,
      wherein the contiguous region and the boundary region have a same size and at least a portion of the block remains unwritten after programming the data in the contiguous region.

2. The method of claim 1, wherein programming the data comprises copying data in the identified boundary region to the region that is contiguous to the identified boundary region.

3. The method of claim 2, further comprising, in response to receiving the shut-down request, updating, for a respective open block in the list, an XOR parity table for the open block, wherein:
   a table entry in the XOR parity table corresponds to an XOR parity stripe;
   the table entry includes a plurality of bits, and each bit corresponds to a distinct region in the respective open block and indicates whether the corresponding region is the region contiguous to the identified boundary region of the respective open block.

4. The method of claim 3, further comprising, in response to receiving the shut-down request, storing the XOR parity table in the respective open block.

5. The method of claim 2, further comprising, after shutting-down the storage device and subsequently resuming operation of the storage device, while reading data from a respective block in which data was copied to the region contiguous to the identified boundary region in the respective block, using the data that was copied to the region contiguous to the identified boundary region to recover data stored in the identified boundary region.

6. The method of claim 1, wherein programming the data comprises writing a data pattern to the region that is contiguous to the identified boundary region.

7. The method of claim 6, wherein the data pattern comprises a predefined dummy data pattern independent of data stored in the identified boundary region.

8. A storage device, comprising:
non-volatile memory;
a host interface;
a storage device controller coupled to the non-volatile memory and the host interface, the storage device controller including:
   means for receiving, via the host interface, a shut-down request from a host device external to the storage device;
   in response to receiving the shut-down request:
      means for obtaining a list of one or more open blocks, each open block having at least one un-programmed word line, each open block including a boundary region corresponding to a last written portion, and a non-boundary region comprising one or more written pages or one or more written word lines; and
   for each open block in the list of open blocks:
      means for identifying the boundary region of the block; and
      means for programming data in a region that is contiguous to the identified boundary region,
         wherein the contiguous region and the boundary region have a same size and at least a portion of the block remains unwritten after programming the data in the contiguous region.

9. The storage device of claim 8, wherein the storage device controller includes one or more processors and one or more controller modules executed by the one or more processors to perform a set of operations.

10. The storage device of claim 9, wherein the one or more controller modules include instructions for copying data in the identified boundary region to the region that is contiguous to the identified boundary region.

11. The storage device of claim 10, wherein the one or more controller modules include:
   a command module configured to receive the shut-down request from the host device external to the storage device;
   a shut-down module configured to, in response to receiving the shut-down request:
      obtain the list of one or more open blocks; and
      for each open block in the list of open blocks:
         identify the boundary region of the block; and
         initiate programming data in the contiguous region; and
   a programming module configured to program data in a specified region of a specified block.

12. The storage device of claim 11, wherein the one or more controller modules further include an XOR parity table generator, wherein:
   the XOR parity table generator is configured to update, in response to the shut-down request, for a respective open block in the list, an XOR parity table for the open block, wherein a table entry in the XOR parity table corresponds to an XOR parity stripe;
   the table entry includes a plurality of bits, and each bit corresponds to a distinct region in the respective open block and indicates whether the corresponding region is the region contiguous to the identified boundary region of the respective open block.

13. The storage device of claim 12, wherein the one or more controller modules include instructions to store the XOR parity table in the respective open block in response to the shut-down request.

14. The storage device of claim 10, wherein the one or more controller modules include a data reuse module, and the data reuse module is configured to use the data that was copied to the region contiguous to the identified boundary region of a respective block, in the list of blocks, to recover data stored in the identified boundary region of the respective block.

15. The storage device of claim 9, wherein the one or more controller modules include instructions for writing a data pattern to the region that is contiguous to the identified boundary region.

16. The storage device of claim 15, wherein the data pattern comprises a predefined dummy data pattern independent of data stored in the identified boundary region.

17. The storage device of claim 9, wherein the one or more controller modules include instructions for recording metadata, for a respective open block in the list, identifying the region, contiguous to the identified boundary region.

18. The storage device of claim 9, wherein the one or more controller modules include instructions for recording metadata, for a respective open block in the list, indicating that the region, contiguous to the identified boundary region, is to be excluded from data compaction.

19. The storage device of claim 8, wherein the identified boundary region comprises one or more word lines or one or more pages.

20. A non-transitory computer-readable storage medium, storing one or more programs configured for execution by one or more processors of a storage device, the one or more programs including instructions that when executed by the one or more processors cause the storage device to:
   in response to receiving a shut-down request from a host device:
      obtain a list of one or more open blocks, each open block having at least one un-programmed word line, each open block including a boundary region corresponding to a last written portion, and a non-boundary region comprising one or more written pages or one or more written word lines; and
   for each open block in the list of open blocks:
      identify the boundary region of the block; and
      program data in a region that is contiguous to the identified boundary region,
         wherein the contiguous region and the boundary region have a same size and at least a portion of the block remains unwritten after programming the data in the contiguous region.

* * * * *